United States Patent
Han (10) Patent No.: US 7,217,967 B2
(45) Date of Patent: May 15, 2007

(54) CMOS IMAGE SENSOR AND METHOD FOR MANUFACTURING THE SAME

(75) Inventor: Chang Hun Han, Icheon-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 217 days.

(21) Appl. No.: 10/746,980

(22) Filed: Dec. 23, 2003

(65) Prior Publication Data

US 2005/0064620 A1    Mar. 24, 2005

(30) Foreign Application Priority Data

Sep. 22, 2003    (KR) ............ 10-2003-0065625

(51) Int. Cl.
    *H01L 27/148*    (2006.01)
(52) U.S. Cl. ............... 257/233; 257/293; 257/E27.133
(58) Field of Classification Search ............... 257/233, 257/292, 444, 463, 293
    See application file for complete search history.

(56) References Cited

U.S. PATENT DOCUMENTS

| | | | |
|---|---|---|---|
| 5,841,126 A | 11/1998 | Fossum et al. | |
| 5,886,659 A | 3/1999 | Pain et al. | |
| 5,990,506 A | 11/1999 | Fossum et al. | |
| 6,005,619 A | 12/1999 | Fossum | |
| 6,021,172 A | 2/2000 | Fossum et al. | |
| 6,462,365 B1 | 10/2002 | He et al. | |
| 6,706,550 B2 * | 3/2004 | Lee et al. | 438/57 |
| 6,818,930 B2 | 11/2004 | Mouli et al. | |
| 6,855,595 B2 * | 2/2005 | Han et al. | 438/241 |
| 2005/0224841 A1 * | 10/2005 | Nakamura et al. | 257/215 |

FOREIGN PATENT DOCUMENTS

| KR | 2001-0061349 A | 7/2001 |
|---|---|---|
| KR | 2001-0061353 A | 7/2001 |
| KR | 2003-0052639 A | 6/2003 |

OTHER PUBLICATIONS

Korean Office Action dated Jun. 20, 2005; Korean Application No. 9-5-2005-028442595.

* cited by examiner

*Primary Examiner*—Quoc Hoang
(74) *Attorney, Agent, or Firm*—Andrew D. Fortney (57) ABSTRACT

A CMOS image sensor and a manufacturing method thereof are disclosed. The gates of the transistors are formed in an active region of a unit pixel, and at the same time, a passivation layer is formed on an edge portion of the active region of a photodiode to have the same laminate structure as the gates of the transistors. Impurities for a diffusion region of the photodiode are ion-implanted into the active region for the photodiode, after the laminate structure is formed. The passivation layer prevents the edge portion from being damaged by ion implantation at the boundary or interface between the photodiode diffusion region and an isolation layer, which reduces dark current and/or leakage current of the CMOS image sensor.

19 Claims, 11 Drawing Sheets

Fig. 1

(Prior Art)

Fig. 2

(Prior Art)

Fig. 3

(Prior Art)

CMOS IMAGE SENSOR AND METHOD FOR MANUFACTURING THE SAME

BACKGROUND OF THE INVENTION

1. Field of the Invention

The present invention relates to a CMOS image sensor, and more particularly to a CMOS image sensor and method for manufacturing the same, in which a diffusion region of a photodiode is disposed apart from an isolation layer, and thereby a dark current is reduced.

2. Description of the Prior Art

In general, an image sensor is a semiconductor device for converting an optical image into an electrical signal, and is generally classified into a charge coupled device (CCD) and a complementary MOS (CMOS) image sensor.

The CCD is a device constructed in such a manner that each MOS capacitor is adjacently disposed to each other, and that charge carriers are stored on any one of the MOS capacitors and then transferred to another MOS capacitor next to the MOS capacitor that stores the charge carrier. The CCD has various disadvantages, such as a complicated drive mode, high power consumption, a complicated manufacturing process derived from a relatively high number of photolithographic process steps and so forth. Additionally, the CCD has a disadvantage in that it is difficult to make a product compact, due to difficulty in integrating various circuits such as a controlling circuit, a signal processing circuit, analog/digital converting circuit and so on into a chip for the CCD.

Currently, CMOS image sensors are attracting attention as a next generation image sensor for overcoming the disadvantages of the CCD. The CMOS image sensor is a device employing a switching mode based on MOS transistors formed in each of the unit pixels on a semiconductor substrate using CMOS technology, making use of a controlling circuit, a signal processing circuit and so on as peripheral circuits, and sequentially detecting outputs of each unit pixel by means of the MOS transistors. That is, the CMOS image sensor sequentially detects electrical signals of each unit pixel in a switching mode to realize an image through formation of a photodiode and a MOS transistor within a unit pixel.

The CMOS image sensor has advantages such as low power consumption, a relatively simple manufacturing process resulting from a smaller number of photolithographic process steps and so on, because it makes use of CMOS manufacturing technology. In addition, the CMOS image sensor has an advantage in that it is easy to make a product compact by integration of a controlling circuit, a signal processing circuit, an analog/digital converting circuit, etc. into a chip for the CMOS image sensor. For this reason, the CMOS image sensor is presently broadly used in various applications, such as digital still cameras, digital video cameras and so forth.

Figure 1:
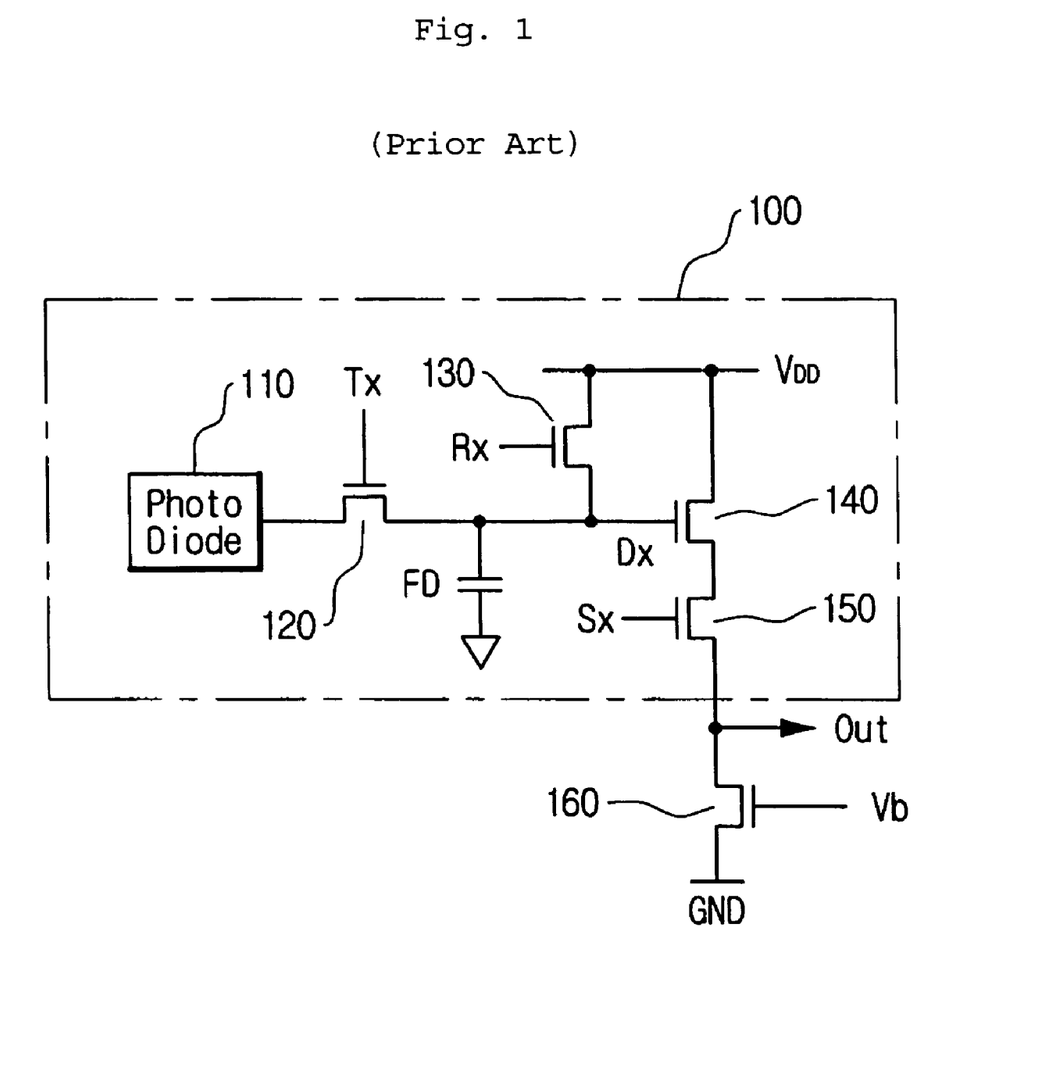
FIG. 1 shows a circuit for a unit pixel of a general CMOS image sensor.

FIG. 1 shows a circuit for a unit pixel of a general CMOS image sensor. As shown in FIG. 1, the unit pixel 100 of the CMOS image sensor includes a photodiode 110 as a photoelectric transformation section and four transistors. Each of the four transistors is a transfer transistor 120, a reset transistor 130, a drive transistor 140 and a select transistor 150. An output terminal OUT of the unit pixel 100 is connected with a load transistor 160. Herein, a reference numeral FD is a floating diffusion region, a reference numeral Tx is gate voltage of the transfer transistor 120, a reference numeral Rx is gate voltage of the reset transistor 130, a reference numeral Dx is gate voltage of the drive transistor 140, and a reference numeral Sx is gate voltage of the select transistor 150.

Figure 2:
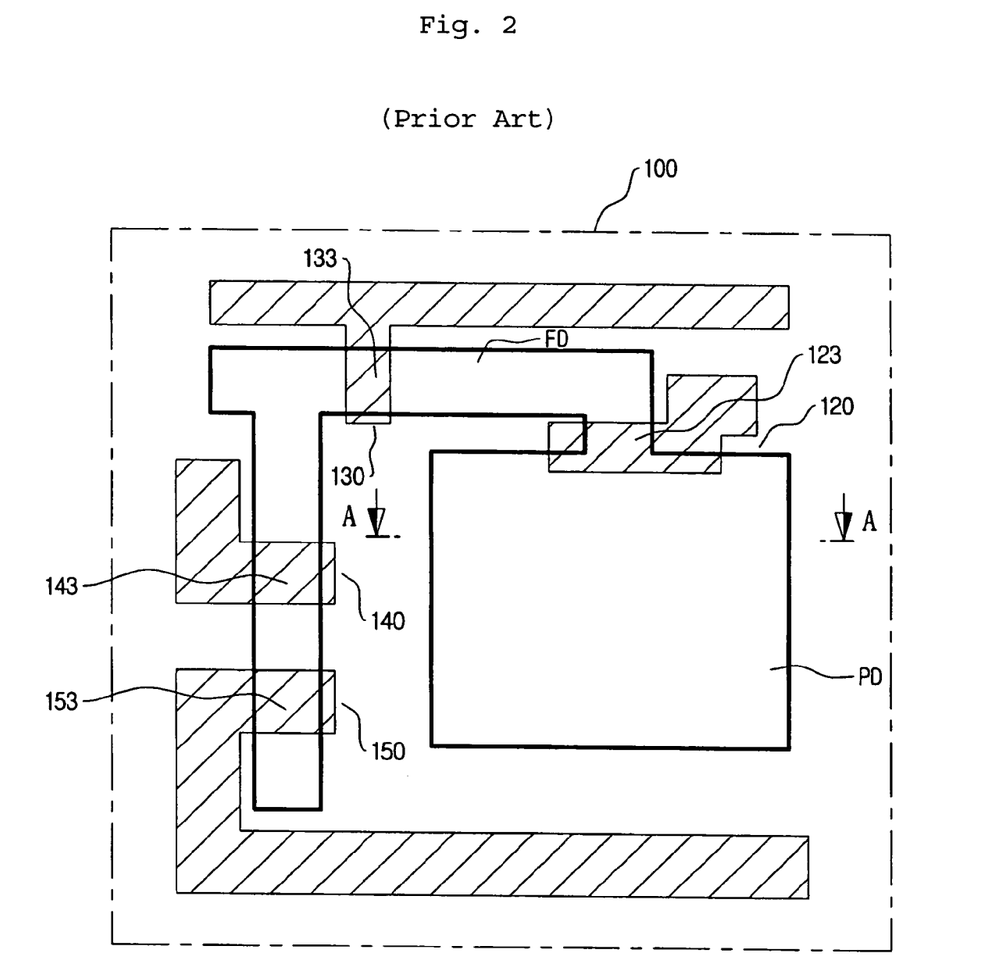
FIG. 2 shows a layout of a unit pixel of the conventional CMOS image sensor.

FIG. 2 shows a layout of a unit pixel of the conventional CMOS image sensor. As shown in FIG. 2, in the unit pixel 100, an active region is a region defined by a bold solid line and an isolation region is a region outside the active region in which an isolation layer (not shown) is formed. The gates 123, 133, 143 and 153, respectively of the transfer transistor 120, reset transistor 130, drive transistor 140 and select transistor 150 are disposed as to be across an upper portion of the active region. The reference numeral FD is a floating diffusion region and the reference numeral PD is a photodiode portion.

Figure 3:
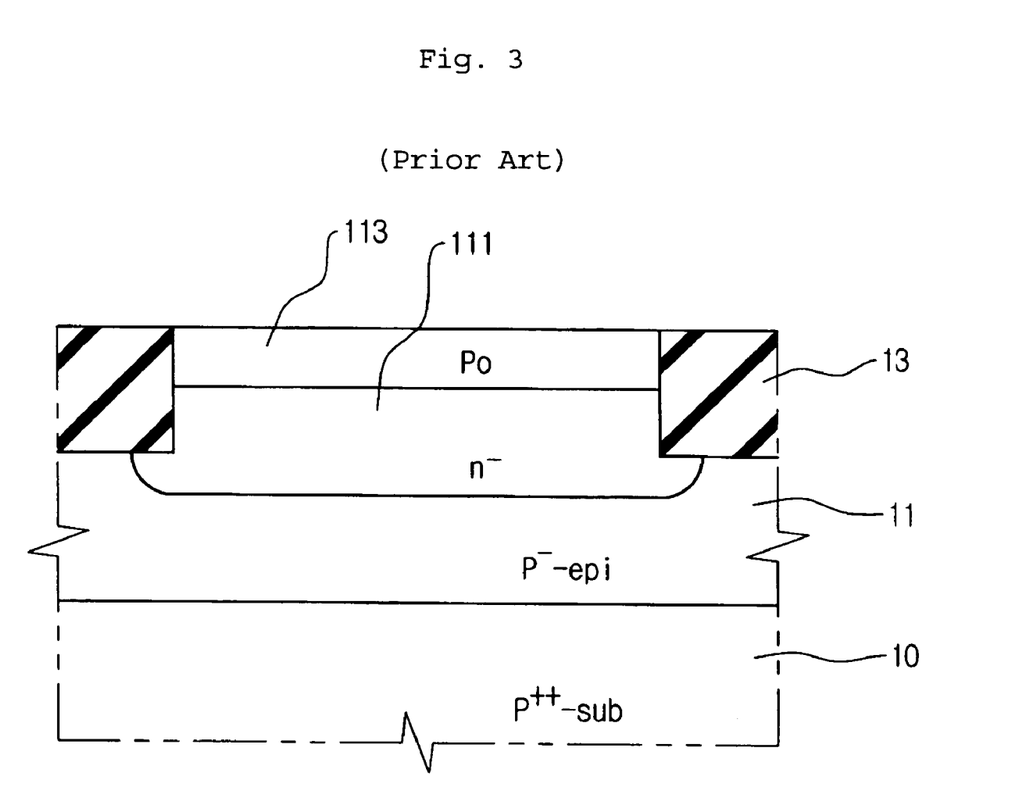
FIG. 3 is a structural cross-sectional view showing a portion of a photodiode of a unit pixel taken along a line A—A of FIG. 2.

FIG. 3 is a structural cross-sectional view showing the photodiode portion of the unit pixel taken along a line A—A of FIG. 2. As shown in FIG. 3, a $P^-$ type epitaxial layer 11 is formed on a $P^{++}$ type semiconductor substrate 10. To define an active region of the semiconductor substrate 10, an isolation layer 13 is formed on a portion of the epitaxial layer 11 for an isolation region of the semiconductor substrate 10. An $n^-$ type diffusion region 111 and a $P^0$ type diffusion region 113 of the photodiode PD are formed on a portion of the epitaxial layer 11 for a photodiode region of the active region, the $P^0$ type diffusion region 113 being positioned on the $n^-$ type diffusion region 111.

The conventional CMOS image sensor 100 with such construction may suffer from degradations of device performance and electric charge storing capacity, due to an increase of dark current.

Dark current is generated by electrons transferred to the floating diffusion region from the photodiode in a state where light is not yet incident to the photodiode. It has been reported that dark current has been caused generally from various kinds of defects, such as a dangling bond and so forth, on a neighboring portion adjacent to the surface of the semiconductor substrate, a boundary portion of the isolation layer and the $P^0$ type diffusion region, a boundary portion of the isolation layer and the $n^-$ type diffusion region, and/or a boundary portion of the $P^0$ type diffusion region and the $n^-$ type diffusion region. Dark current may cause considerable problems such as degradations of performance and electric charge storing capacity in the CMOS image sensor under low illumination conditions.

Accordingly, the conventional CMOS image sensor has used both the $P^0$ type diffusion region and the $n^-$ type diffusion region for the photodiode in order to reduce dark current generated especially from the neighboring portion adjacent to the surface of a silicon substrate. However, the conventional CMOS image sensor has been greatly affected by dark current generated at the boundary portions of the isolation region and the $P^0$ type diffusion region, and the $P^0$ type diffusion region the $n^-$ type diffusion region.

More particularly, as shown in FIG. 3, when patterns (not shown) of a photoresist as a mask layer against an ion implantation for forming the $n^-$ type diffusion region 111 and the $P^0$ type diffusion region 113 of the photodiode PD is formed on the semiconductor substrate 10, the whole active region for the photodiode PD is exposed in an opening of the photoresist patterns. In such state, when impurities for the $n^-$ type diffusion region 111 and the $P^0$ type diffusion region 113 are ion-implanted in the active region of the photodiode PD, the impurities for the $n^-$ type diffusion region 111 and the $P^0$ type diffusion region 113 are also ion-implanted to the boundary portion between the active region and the isolation layer 13 of the photodiode PD.

Thus, damages by the ion implantation of impurities are caused at the boundary portion between the n⁻/P⁰ type diffusion regions 111 and 113 and the isolation layer 13, further generating defects. The defects can cause a generation of electric charge or hole carriers, and also provide places for recombination of the electric charges and the holes. Consequently, such defects can increase leakage current of the photodiode and therefore dark current of the CMOS image sensor.

As described above, the conventional CMOS image sensor has a construction in which impurities for forming the diffusion region of the photodiode are also ion-implanted on the boundary portion between the isolation layer and the active region for the photodiode when the impurities are ion-implanted for forming the diffusion region of the photodiode. Thus, the conventional CMOS image sensor has a limit in increasing performance characteristics of the device because it is difficult to restrict dark current generated at the boundary portion between the isolation layer and the active region for the photodiode, and to maintain device characteristics between the pixels constant.

Meanwhile, Korean Laid-Open Patent Publication Nos. 2001-61349, 2001-61353 and 2003-52639 disclose a method for reducing dark current of CMOS image sensor, which, however, do not present a solution to restrict an increase of dark current by preventing impurities from being ion-implanted to the boundary portion between an isolation layer and an active region for a photodiode.

Also, U.S. Pat. No. 6,462,365, entitled "Active Pixel Having Reduced Dark Current in a CMOS Image Sensor," discloses a method for restricting an increase of dark current due to a dangling bond at the surface of a photodiode, in which an isolation layer and a transfer gate as a passivation layer are formed on the surface of the photodiode. However, the method also does not restrict an increase of dark current by preventing impurities from being ion-implanted to the boundary portion between the isolation layer and the active region for the photodiode.

SUMMARY OF THE INVENTION

Accordingly, the present invention has been made to solve the above-mentioned problem(s), and an object of the present invention is to improve device characteristics of a CMOS image sensor by preventing impurities from being ion-implanted to the boundary portion between an isolation layer and an active region for a photodiode, thus reducing dark current.

Another object of the present invention is to improve device characteristics of a CMOS image sensor by maintaining device characteristics between pixels uniform.

A further object of the present invention is to manufacture a CMOS image sensor without complicating its manufacturing process by using a conventional CMOS manufacturing processes thereof the way it is (e.g., without adding new steps).

In order to accomplish these objects, there is provided a CMOS image sensor comprising: (a) a semiconductor substrate having an isolation region and an active region for a unit pixel; (b) at least one transistor formed on the semiconductor substrate and/or in the unit pixel; and (c) an impurity diffusion region for a photodiode located in the active region at a distance from an isolation layer. That is, the impurity diffusion region for the photodiode is spaced apart a certain minimum distance from the isolation layer of the isolation region.

Preferably, the CMOS image sensor further comprises a passivation layer formed over a boundary between the isolation layer and the active region on the semiconductor substrate so as to dispose the impurity diffusion region for the photodiode a certain distance away from the isolation layer of the isolation region.

Preferably, the passivation layer has a first layer and a second layer thereon, in which the first layer comprises a material of a gate insulating layer for the transistor(s) and the second layer comprises a material of a gate of the transistor(s). More preferably, the first layer comprises a thermal oxide layer and the second layer comprises a polycrystalline silicon (polysilicon) layer. Optionally, the second layer may consist essentially of a highly doped polysilicon layer and a silicide layer thereon.

Preferably, the semiconductor substrate comprises a P⁺⁺ type silicon substrate having a P⁻ type epitaxial layer, and the diffusion region for the photodiode comprises an n⁻ type diffusion region. More preferably, a P⁰ type diffusion region is formed on the n⁻ type diffusion region for the photodiode.

According to another aspect of the present invention, there is provided a method for manufacturing a CMOS image sensor, the method comprising the steps of: (1) forming an isolation layer on a semiconductor substrate so as to define an active region for a unit pixel; (2) forming at least one transistor gate structure on the semiconductor substrate and a passivation layer over a boundary between the isolation layer and the active region, preferably at the same time; and (3) implanting impurities into a portion of the active region to form a diffusion region for the photodiode.

Preferably, the passivation layer has a construction of a first layer and a second layer thereon, in which the first layer comprises a transistor gate insulating layer material and the second layer comprises a transistor gate material. More preferably, the first layer comprises a thermal oxide layer (such as thermally grown SiO₂) and the second layer comprises a polysilicon layer. Alternatively, the second layer consists essentially of a highly doped polysilicon layer and a metal silicide layer thereon.

Preferably, the semiconductor substrate comprises a P⁺⁺ type silicon substrate having a P⁻ type epitaxial layer thereon, and the method further comprises forming an n⁻ type diffusion region for the photodiode by ion implantation. More preferably, the method according to the present invention may further comprise a step of performing a P⁰ type ion implantation on the n⁻ type diffusion region for the photodiode.

Accordingly, the present invention is provided so that the passivation layer (a laminate structure generally the same as the transistor gate structure) is formed on an edge portion of the active region for the photodiode, and is used as a masking layer against an ion implantation. The result is a photodiode diffusion region spaced apart from the isolation layer, which prevents damage by ion implantation of impurities into the boundary portion (or interface) between the isolation layer and the photodiode diffusion region, and which restricts an increase of dark current of the CMOS image sensor.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description and drawings, the same reference numerals are used to designate the same or similar components, and so repetition of the description of the same or similar components will be omitted.

Figure 4:
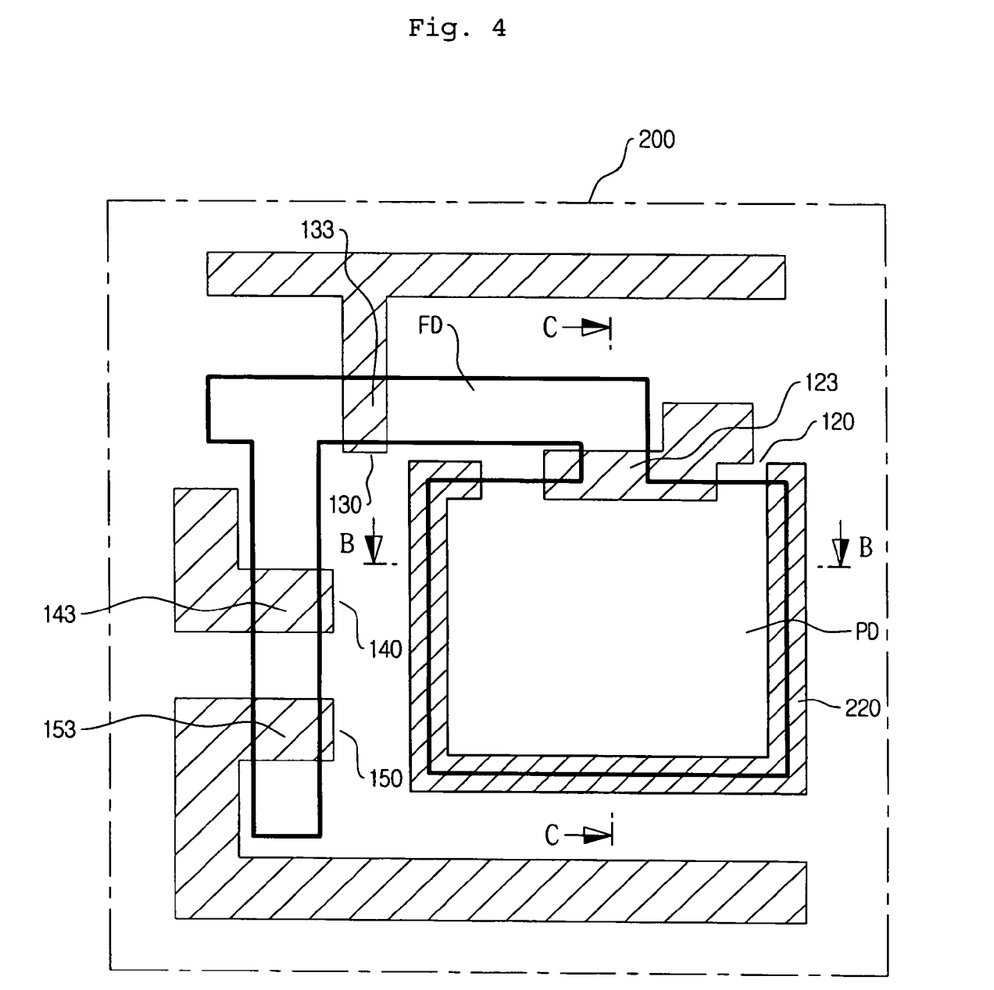
FIG. 4 is a layout of a unit pixel of a CMOS image sensor of the present invention.

FIG. 4 is a layout of a unit pixel of a CMOS image sensor of the present invention.

Referring to FIG. 4, in a unit pixel 200 of a CMOS image sensor of the present invention, an active region is a region defined by a bold solid line and an isolation region is a region outside the active region in which an isolation layer (not shown) is formed. The gates 123, 133, 143 and 153, respectively of the transfer transistor 120, reset transistor 130, drive transistor 140 and select transistor 150 are disposed as to be across an upper portion of the active region.

Furthermore, in order to prevent an edge portion of the active region for the photodiode PD from being damaged by an ion implantation of impurities, a passivation layer 220 is commonly disposed on the edge portion and the isolation layer. Also, the passivation layer 220 is formed so that it extends along the boundary portion between the active region for the photodiode and the isolation layer. The reference numeral FD is a floating diffusion region.

Meanwhile, although the unit pixel 200 of the present invention is illustrated to have one photodiode and four transistors, in fact, it may have one photodiode and three transistors, e.g., a reset transistor, a driver transistor and a select transistor. For convenience of explanation, the present invention will be described with reference to a unit pixel having a structure of one photodiode and four transistors.

Figure 5:
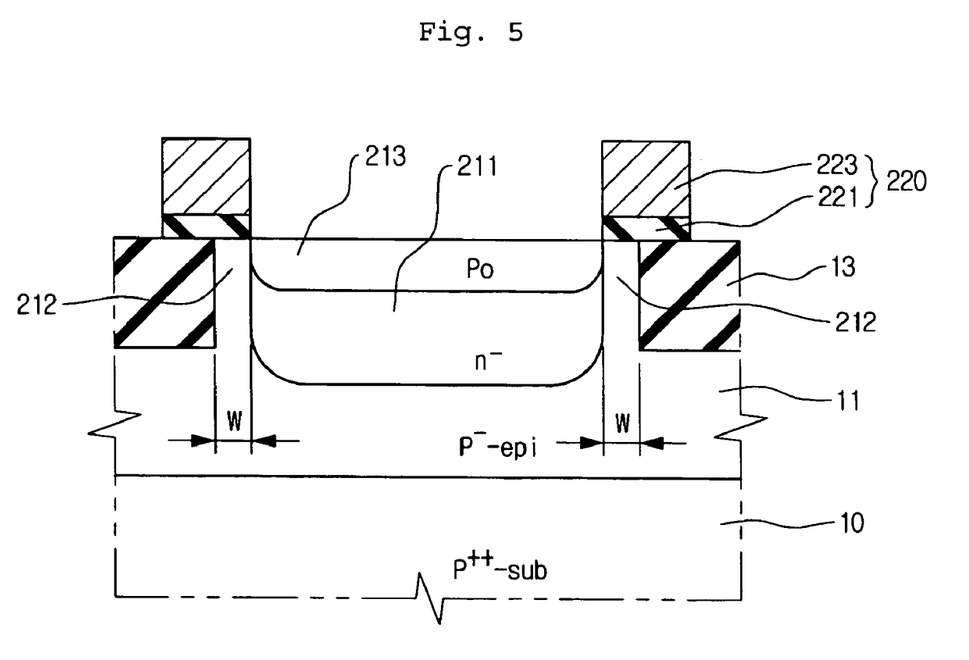
FIG. 5 is a structural cross-sectional view showing a portion of a photodiode of a unit pixel taken along a line B—B of FIG. 4.
Figure 6:
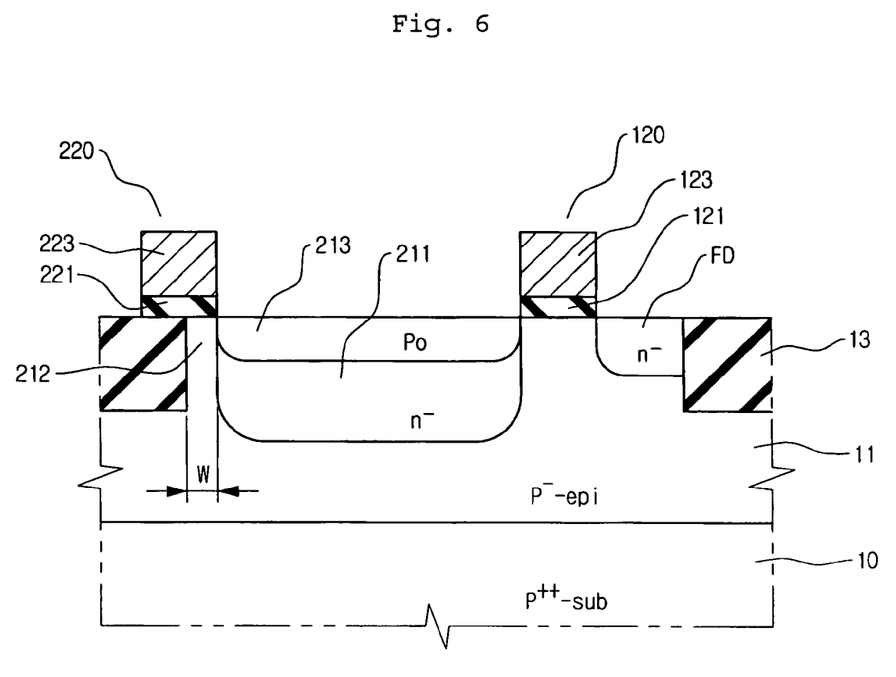
FIG. 6 is a structural cross-sectional view showing a portion of a photodiode of a unit pixel and a transfer gate taken along a line C—C of FIG. 4.

FIG. 5 is a structural cross-sectional view showing a portion of a photodiode of a unit pixel taken along a line B—B of FIG. 4, and FIG. 6 is a structural cross-sectional view showing a portion of a photodiode of a unit pixel and a transfer gate taken along a line C—C of FIG. 4, which drawings are now described in corporation with each other.

Referring to FIGS. 5 and 6, a P$^-$ type epitaxial layer 11 is formed on a P$^{++}$ type semiconductor substrate 10. The semiconductor substrate may employ, for example, a single crystal silicon substrate. To define an active region of the semiconductor substrate 10, an isolation layer 13 is formed on a portion of the epitaxial layer 11 for an isolation region of the semiconductor substrate 10. Although the illustrated isolation layer 13 is formed by a shallow trench isolation (STI) process, it may also be formed by a local oxidation of silicon (LOCOS) process, etc. Referring to FIG. 6 only, a gate insulating layer 121 and a gate 123 of a transfer transistor 120 are formed on a portion of the epitaxial layer 11 for the transfer transistor 120.

Referring back to both FIGS. 5 and 6, an n$^-$ type diffusion region 211 and a P$^0$ type diffusion region 213 for photodiode PD are formed in the epitaxial layer 11 in such a manner that they are spaced apart from the isolation layer 13 with an edge portion 212 of the active region disposed therebetween. That is, the n$^-$ type diffusion region 211 and the P$^0$ type diffusion region 213 are disposed spaced apart from the isolation layer 13 by, for example, a distance of about 50 μm or more. This is to restrict any increase in leakage current and/or dark current generated on the boundary or interface between the n$^-$/P$^0$ type diffusion regions 211 and 213 and the isolation layer 13. The edge portion 212 of the epitaxial layer 11 is a region in which impurities for forming the n$^-$ type diffusion region 211 and the P$^0$ type diffusion region 213 are not implanted or diffused.

A passivation layer 220 is formed on a portion of both the edge portion 212 and the isolation layer 13 before formation of n$^-$ type diffusion region 211 and the P$^0$ type diffusion region 213. Herein, the passivation layer 220 has the same laminate structure as a gate structure of the transfer transistor 120. That is, the passivation layer 220 has a first layer 221 and a second layer 223 thereon. The first layer 221 may comprise the same material as a gate insulating layer 121 of the transfer transistor 120, for example, a thermal oxide layer such as SiO$_2$, etc. The second layer 223 may comprise the same material as the gate 123 of the transfer transistor 120, for example, a polysilicon layer (which may be highly doped with a conventional polysilicon dopant) or such a polysilicon layer with a conventional silicide layer thereon.

Also, the floating diffusion region FD is formed in the epitaxial layer 11 in such a manner that it is spaced apart from the n$^-$/P$^0$ type diffusion regions 211 and 213 with the gate 123 of the transfer transistor 120 disposed therebetween.

Meanwhile, although the photodiode PD is illustrated to have the n$^-$/P$^0$ type diffusion regions 211 and 213, in fact, it may have the n$^-$ type diffusion region 211 only. The P$^{++}$ type means a high concentration P type, the P$^0$ type means a middle concentration P type, and the n$^-$ type means a low concentration n type, as is known in the art. The first and second conductive types, respectively may be P type and n type, respectively, or n type and P type, respectively. The present invention will be now described with reference to a photodiode having P$^0$/n$^-$ type diffusion region.

In the present CMOS image sensor, since the passivation layer 220 protects the isolation layer 13 together with the edge portion 212 of the active region for the photodiode PD, impurities for forming the n$^-$/P$^0$ type diffusion regions 211 and 213 of the photodiode PD are not ion-implanted into edge portion 212. Also, the impurities are not ion-implanted into or near the boundary portions between the isolation layer 13 and the n$^-$ type diffusion region 211 and between the isolation layer 13 and the P$^0$ type diffusion region 213. As is apparent from FIGS. 5 and 6, the present invention avoids formation of interfaces between the isolation layer 13, on the one hand, and the n$^-$ type diffusion region 211 and P$^0$ type diffusion region 213, on the other hand.

Thus, an increase in leakage current generated as a result of ion implantation damage to the boundary portions between the isolation layer 13 and (i) the n$^-$ type diffusion region 211 and between the isolation layer 13 and/or (ii) the P$^0$ type diffusion region 213 can be reduced. This also reduces dark current and maintains relatively constant device characteristics between the unit pixels with the result that dark current characteristics, electric charge storing capacity, and therefore device characteristics of the CMOS image sensor, are improved.

A method for manufacturing the present CMOS image sensor will be now described with reference to FIGS. 7A to 7E. For convenience of explanation, the method of the present invention is described based upon a sectional structure of a-unit pixel of FIG. 5.

Figure 7A:
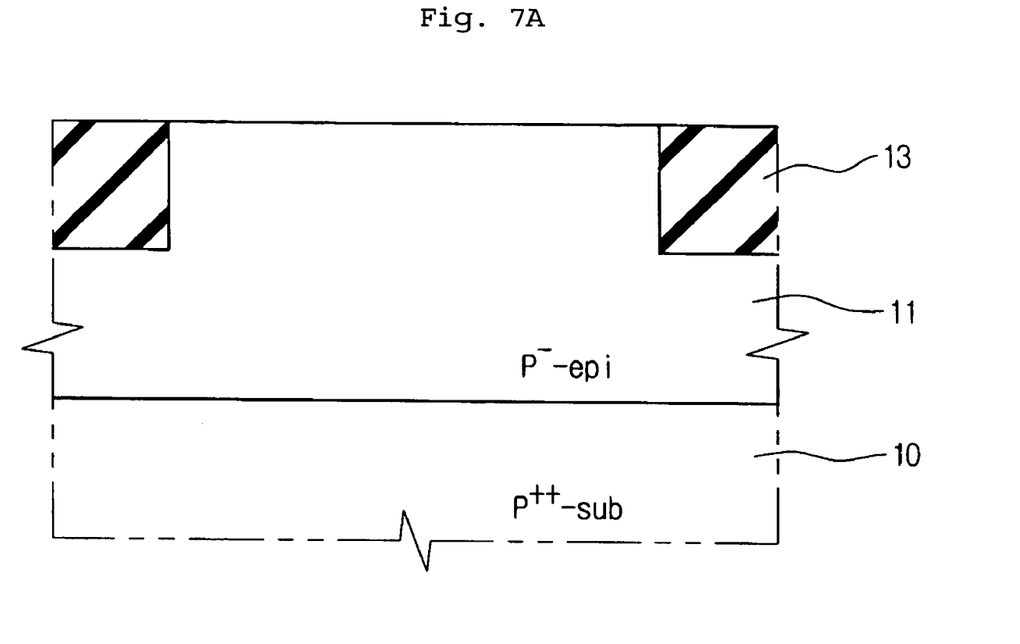
FIGS. 7A to 7E are process views showing a method for manufacturing a CMOS image sensor of the present invention.

Referring to FIG. 7A, a semiconductor substrate 10 is provided. The semiconductor substrate may employ a high concentration and first conductive type, for example, $P^{++}$ type, single crystal silicon substrate. On one surface of the semiconductor substrate 10, for example, a surface on which a device is formed, a low concentration and first conductive type, for example, $P^-$ type, epitaxial layer 11 is grown and formed by an epitaxial process so as to form a depletion region larger and deeper in a photodiode, thereby increasing performance of low voltage photodiode for collecting photocharge and thus improving photosensitivity.

Then, to define an active region for transfer transistor 120, reset transistor 130, drive transistor 140 and select transistor 150 together with an active region of the photodiode PD (see FIG. 4), an isolation layer 13 is formed on a portion of an epitaxial layer 11 by a shallow trench isolation (STI) process. Alternatively, the isolation layer 13 may be formed by a LOCOS process.

Figure 7B:
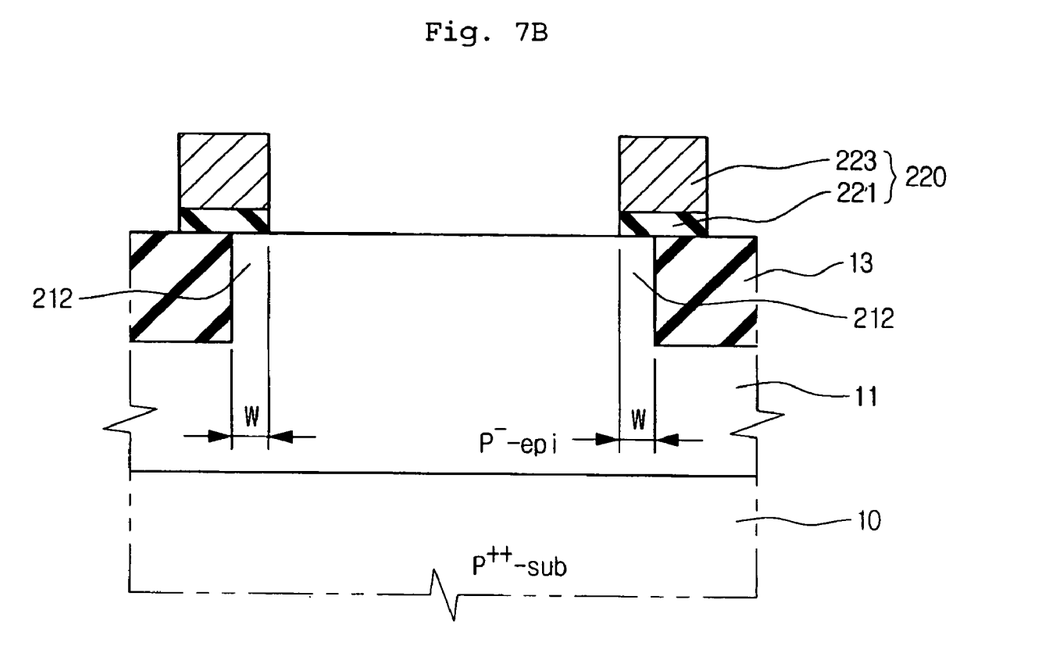

Referring to FIG. 7B, a gate insulating layer for the transfer transistor 120, the reset transistor 130, the drive transistor 140 and the select transistor 150 of FIG. 4 is formed in a desired thickness on the epitaxial layer 11 in the whole area of the active region, including the active region of the photodiode PD. Herein, the gate insulating layer may be formed, for example, by a thermal oxidation process to grow a thermal oxide layer, such as $SiO_2$, over the exposed portions of the epitaxial layer 11.

Then, a conductive layer, for example, a highly doped polysilicon layer for gates 123, 133, 143 and 153 of the transistors 120, 130, 140 and 150, respectively, is formed in a desired thickness on the gate insulating layer. Of course, although it is not shown in the drawing, the conductive layer for the gates may comprise a polysilicon layer and a conventional silicide layer thereon. In such a case, the silicide typically comprises or consists essentially of a metal silicide, preferably a transition metal and/or refractory metal silicide, such as tungsten silicide, molybdenum silicide, titanium silicide, etc.

Then, using conventional photolithography employing a photo mask (not shown) by which patterns for the gates 123, 133, 143 and 153 and the passivation layer 220 are formed, the conductive layer and the gate insulating layer are etched in such a manner that portions thereof corresponding the patterns are left and the rest of the conductive and gate insulating layers are removed. That is, the conductive layer and the gate insulating layer only on the portions for the gates 123, 133, 143 and 153 (as well as the passivation layer 220) are left and the rest of the conductive and gate insulating layers are removed so as to form the gates 123, 133, 143 and 153 and the passivation layer 220. Herein, as shown in FIG. 6, the transfer transistor 120 has a laminate structure of the gate insulating layer 213 and the gate 123. Of course, although are not shown in the drawing, the reset transistor 130, the drive transistor 140 and the select transistor 150 also have the same laminate structure as that of the transfer transistor 120.

Thus, the passivation layer 220 may be formed at the same time and/or commonly on the epitaxial layer 11, over the edge portion 212 in the active region for the photodiode PD and on the isolation layer 13 adjacent to the edge portion 212. Herein, and as also shown in FIG. 4, the passivation layer 220 is formed commonly on the edge portion for the photodiode and the isolation layer while extending along the boundary portion between the active region for the photodiode and the isolation region. The passivation layer 220 may have the same laminate structure as the gate 123. That is, the passivation layer 220 has a first layer 221 and a second layer 223 thereon. The first layer 221 may comprise the same material as the gate insulating layer 121 of the transfer transistor 120, for example, a thermal oxide layer, etc. The second layer 223 may comprise the same material as the gate 123 of the transfer transistor 120, for example, a polysilicon layer, or a polysilicon layer and a silicide layer thereon.

Herein, in a subsequent ion implantation process, when impurities for forming the $n^-/P^0$ type diffusion regions 211 and 213 of the photodiode are implanted in the active region for the photodiode PD, the passivation layer 220 can prevent the impurities from being implanted in the epitaxial layer 11 of the edge portion 212. Thus, since damage by ion implantation is not generated or caused on any boundary or interface between the isolation layer 13 and the $n^-/P^0$ type diffusion regions 211 and 213, an increase of leakage current at the boundary portion can be reduced, thus reducing dark current in the CMOS image sensor, maintaining device characteristics between unit pixels constant, and thus improving device characteristics of the CMOS image sensor.

Preferably, the passivation layer 220 may be formed in such a manner that it extends some distance W (for example, about or above 50 μm) from the isolation layer 13 toward a center portion of the active region of the photodiode PD. This is to prevent the $n^-/P^0$ type diffusion regions 211 and 213 from being in contact with the isolation layer 13 when the $n^-/P^0$ type diffusion regions 211 and 213 are diffused on a subsequent annealing process.

Also, according to the present invention, the gates 123, 133, 143 and 153 of the transfer transistor 120, the reset transistor 130, the drive transistor 140 and the select transistor 150 are simultaneously formed together with the passivation layer 220 by modifying the existing photo mask for forming patterns of the gates 123, 133, 143 and 153 into a new photo mask for forming patterns of the gates 123, 133, 133, 143 and 153 and the passivation layer 220. Accordingly, the present invention can provide a CMOS image sensor in which the manufacturing processes are not further complicated, and the characteristics of dark current are excellent because the present invention utilizes existing manufacturing processes without adding a separate process step or modifying the same (e.g., the process conditions for the various steps need not change and preferably do not change; only one photo mask is modified).

Figure 7C:
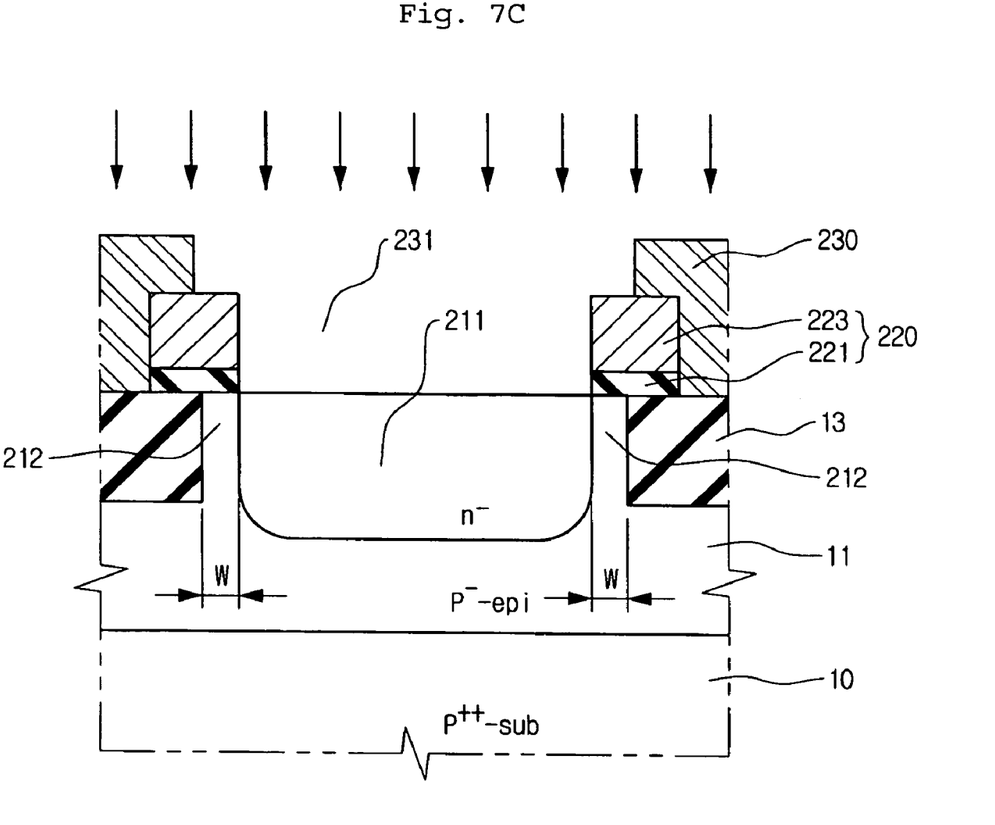

Referring to FIG. 7C, a pattern 230 of a photoresist having an opening 231 exposing (a) an area of the epitaxial layer 11 corresponding to the active region of the photodiode PD to be implanted and (b) a portion of passivation layer 220. Herein, since the passivation layer 220 masks the edge portion 212 of the active region, the epitaxial layer 11 of the active region for the $n^-$ type diffusion region 211 is substantially exposed, except for the masked edge portion 212.

Then, using the pattern 230 of the photoresist and the passivation layer 220 as a masking layer against ion implantation, conductive impurities of a second type, for example, n type, are ion-implanted at a low concentration and high energy into the exposed portion of epitaxial layer 11, thus forming the n⁻ type diffusion region 211. Herein, the n⁻ type diffusion region 211 and isolation layer 13 are spaced apart from each other by a distance W with the edge portion 212 disposed therebetween. Accordingly, the present invention effectively prevents a boundary portion or interface between the isolation layer 13 and the n⁻ type diffusion region 211 from being damaged by ion implantation and from having commercially significant defects due to the damage. This restricts an increase of dark current of the CMOS image sensor.

Figure 7D:
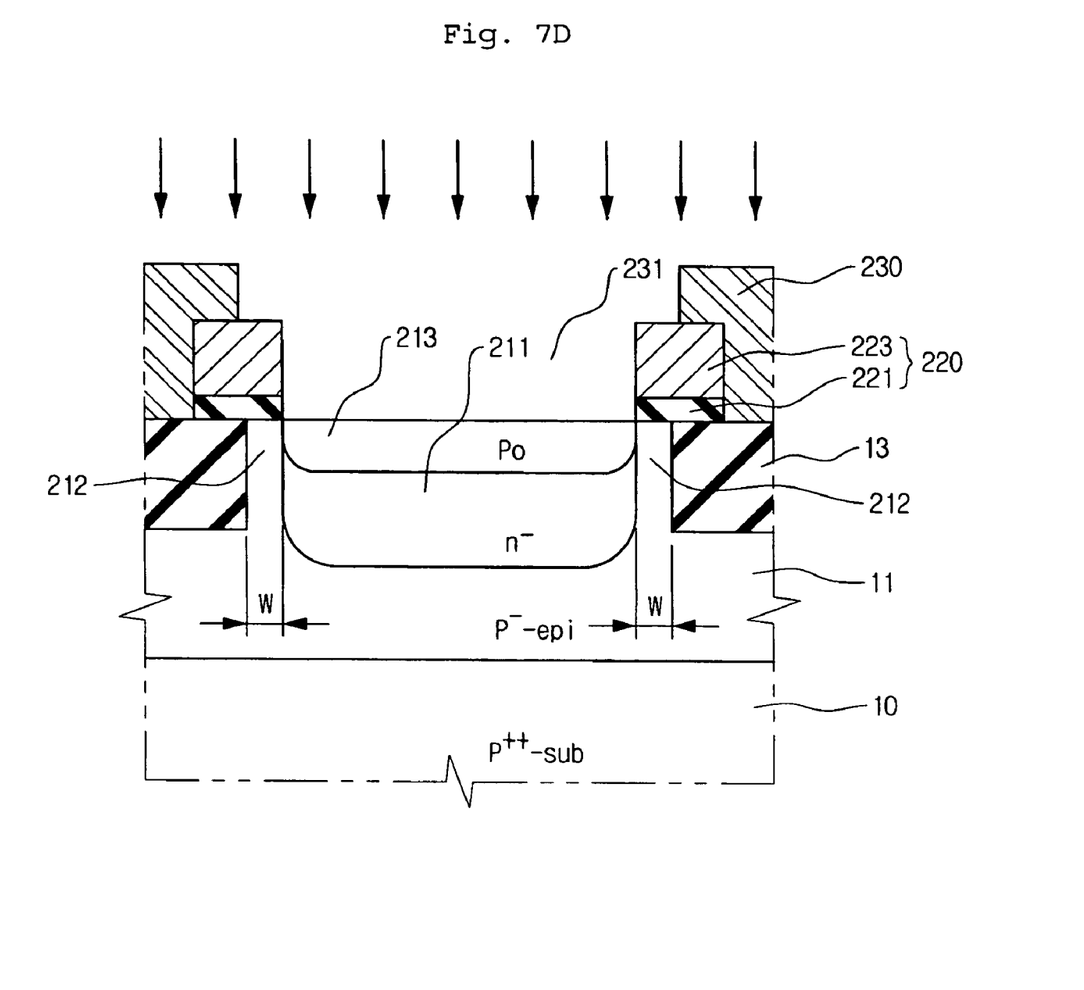

Referring to FIG. 7D, maintaining and/or re-using the patterns 230 of the photoresist and the passivation layer 220 of FIG. 7C as a mask layer against ion implantation, P type impurities are ion-implanted at a medium concentration and low energy to the n⁻ type diffusion region 211, forming the P⁰ type diffusion region 213 of the photodiode on the n⁻ type diffusion region 211. Herein, P⁰ type diffusion region 213 and the isolation layer 13 are disposed or spaced apart from each other by a distance W with the edge portion 212 disposed therebetween. Accordingly, the present invention prevents the boundary portion or interface between the isolation layer 13 and the P⁰ type diffusion region 213 from being damaged by ion implantation and from defects due to the damage. This restricts an increase of dark current of the CMOS image sensor. It is also evident that, by omitting the ion implantation for forming the P⁰ type diffusion region 213, a photodiode having only an n⁻ type diffusion region 211 may be formed.

Figure 7E:
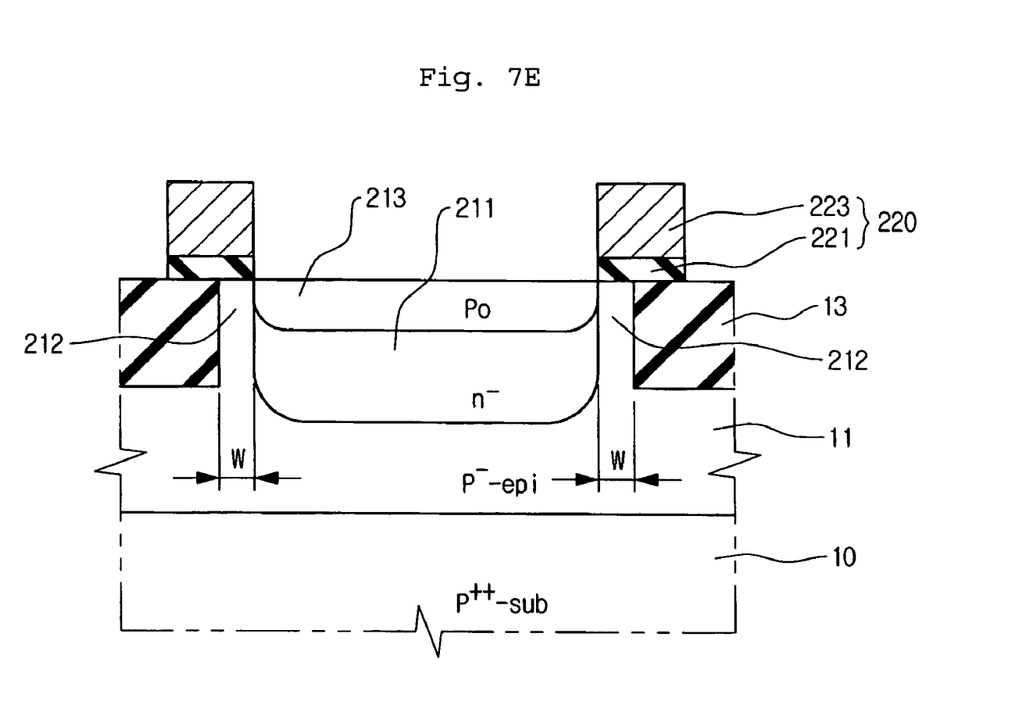

Referring to FIG. 7E, after removing the photoresist pattern 230 of FIG. 7D, impurities ion-implanted to the n⁻ type diffusion region 211 and the P⁰ type diffusion region 213 are diffused through an annealing process, substantially forming a junction between the n⁻ type diffusion region 211 and the P⁰ type diffusion region 213.

Herein, since the n⁻ type diffusion region 211 and the P⁰ type diffusion region 213 are spaced apart from the isolation layer 13 by a distance W, the n⁻ type diffusion region 211 and the P⁰ type diffusion region 213 are not in contact with the isolation layer 13, which prevents an increase of leakage current and/or dark current generated on the boundary portion of the isolation layer 13.

Thereafter (although it is not shown in the drawings), using the existing manufacturing process(es), the floating diffusion region FD and the source/drain diffusion region of the transfer transistor 120, the reset transistor 130, the drive transistor 140 and the select transistor 150 (see, e.g., FIG. 4) are formed so that the manufacturing process for the unit pixel of the CMOS image sensor of the present invention is completed. Since the above-mentioned FD and source/drain diffusion portion of the process has little connection with the novel points of the present invention, further description relating to this portion of the manufacturing process will be omitted.

As described before in detail, in the CMOS image sensor and the manufacturing method thereof of the present invention, the gates of the transistors are formed in the active region of the unit pixel, and at the same time, a passivation layer is formed on the edge portion of the active region of the photodiode to have the same laminate structure as the gates of the transistors. Then, impurities for the diffusion region(s) of the photodiode are ion-implanted into the active region for the photodiode. Herein, the passivation layer prevents the edge portion (and thus, the boundary sand/or interface with the isolation layer 13 outside the active region) from being ion-implanted with impurities for the photodiode. Accordingly, the present invention has advantages in that damage by ion implantation of impurities at the boundary between a photodiode diffusion region and the isolation layer are prevented, which reduces dark current of the COMS image sensor. Also, since the passivation layer and the transistor gates may be formed simultaneously in the present invention, the CMOS image sensor can be manufactured without complicating the existing manufacturing processes and with maintaining the same process steps the way they are.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A CMOS image sensor comprising:
 a) a semiconductor substrate having an isolation region, an edge portion adjacent to the isolation region and an active region for a unit pixel, wherein the edge portion has width of 50 μm or more;
 b) at least one transistor formed on said semiconductor substrate in said unit pixel;
 c) a diffusion region for a photodiode, wherein the edge portion is between said diffusion region and said isolation region; and
 d) an electrically isolated passivation layer on both the edge portion and a portion of the isolation region, but not on the diffusion region.

2. The CMOS image sensor as claimed in claim 1, wherein said transistor comprises a first layer and a second layer, wherein the first layer comprises a gate insulating material and the second layer comprises an electrode material.

3. The CMOS image sensor as claimed in claim 2, wherein said passivation layer comprises a first layer and a second layer, wherein the first layer comprises the same material as the gate insulating material of said transistor and the second layer comprises the same material as the electrode material of said transistor.

4. The CMOS image sensor as claimed in claim 3, wherein said first layer comprises a thermal oxide layer and said second layer comprises a polysilicon doped layer.

5. The CMOS image sensor as claimed in claim 4, wherein said second layer further comprises a silicide layer on said polysilicon layer.

6. The CMOS image sensor as claimed in claim 5, wherein the silicide layer comprises a material selected from a group consisting of tungsten silicide, molybdenum silicide and titanium silicide.

7. The CMOS image sensor as claimed in claim 3, wherein said transistor further comprises source/drain diffusion regions adjacent to said first and second layers of said transistor.

8. The CMOS image sensor as claimed in claim 1, wherein said isolation region comprises an isolation layer.

9. The CMOS image sensor as claimed in claim 8, wherein said isolation layer comprises a shallow trench isolation layer or LOCOS layer.

10. The CMOS image sensor as claimed in claim 1, wherein said semiconductor substrate comprises a P⁺⁺ type silicon substrate having a P⁻ type epitaxial layer thereon, and said diffusion region comprises an n⁻ type diffusion region.

11. The CMOS image sensor as claimed in claim 10, further comprising a P⁰ type diffusion region on said n⁻ if type diffusion region.

12. The CMOS image sensor as claimed in claim 1, wherein the edge portion has a medial edge aligned with a medial side of the passivation layer and lateral edge interfacing with the isolation region.

13. The CMOS image sensor as claimed in claim 1, wherein the substrate comprises single crystal silicon.

14. The CMOS image sensor as claimed in claim 1, wherein the edge portion is undoped.

15. A CMOS image sensor comprising:
  a) a semiconductor substrate having a photodiode region having at least four sides, an isolation region along first, second and third sides of the photodiode region, and edge portions between each of the first, second and third sides of the photodiode region and the corresponding isolation region, wherein the edge portions have a width of 50 µm or more;
  b) at least one transistor formed on said semiconductor substrate adjacent to a fourth side of the photodiode region; and
  c) a passivation layer on both the edge portion and a portion of the isolation region along the first, second and third sides of the photodiode, but not on the photodiode region.

16. The CMOS image sensor as claimed in claim 15, further comprising a transfer transistor, a reset transistor, a driver transistor, and a select transistor.

17. The CMOS image sensor as claimed in claim 15, wherein the edge portion has a medial edge aligned with a medial side of the passivation layer and lateral interfacing with the isolation region.

18. The CMOS image sensor as claimed in claim 15, further comprising a diffusion region at the surface of the photodiode region, interfacing with the edge portion.

19. A CMOS image sensor comprising:
  a) a semiconductor substrate having a photodiode region having at least four sides, an isolation region along first, second and third sides of the photodiode region, and edge portions between each of the first, second and third sides of the photodiode region and the corresponding isolation region;
  b) at least one transistor formed on said semiconductor substrate adjacent to a fourth side of the photodiode region; and
  a) an electrically isolated passivation layer on both the edge portion and a portion of the isolation region along the first, second and third sides of the photodiode, but not on the photodiode region.

* * * * *